United States Patent
Gonzalez Ballester et al.

(10) Patent No.: US 6,949,928 B2
(45) Date of Patent: Sep. 27, 2005

(54) PARALLEL MR IMAGING USING HIGH-PRECISION COIL SENSITIVITY MAP

(75) Inventors: Miguel Angel Gonzalez Ballester, Nice (FR); Yoshio Machida, Tochigi (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/466,635

(22) PCT Filed: Jan. 18, 2002

(86) PCT No.: PCT/JP02/00343
§ 371 (c)(1),
(2), (4) Date: Oct. 20, 2003

(87) PCT Pub. No.: WO02/056767
PCT Pub. Date: Jul. 25, 2002

(65) Prior Publication Data
US 2004/0070394 A1 Apr. 15, 2004

(30) Foreign Application Priority Data
Jan. 19, 2001 (JP) .................................. 2001-012478

(51) Int. Cl.[7] ................................................ G01V 3/00
(52) U.S. Cl. ........................ 324/307; 324/309; 324/318
(58) Field of Search .............................. 324/307, 309, 324/318; 382/128, 154

(56) References Cited

U.S. PATENT DOCUMENTS

| | | | |
|---|---|---|---|
| 6,396,269 B1 * | 5/2002 | Hajnal et al. ............... | 324/307 |
| 6,556,009 B2 * | 4/2003 | Kellman et al. ........... | 324/309 |
| 2004/0070394 A1 * | 4/2004 | Gonzalez Ballester et al. .. | 324/307 |

FOREIGN PATENT DOCUMENTS

EP    WO 01/8076 A2 * 11/2001

OTHER PUBLICATIONS

Pruessmann et al., "Sense:Sensitivity Encoding for Fast MRI" Magnetic Resonance in Medicine, Academic Press, Duluth, MN, US., vol. 42, No. 5, Nov. 1999, pp. 952–962, PX000866655.

Dawant et al., "Correction of Intensity Variations in MR Images for Computer–Aided Tissue Classification", IEEE Transactions on Medical Imaging, IEEE Inc., New York, US, vol. 12, No. 4, Dec. 1, 1993, pp. 770–781, XP000447025.

Gonzalez Ballester et al, "Robust Estimation of Coil Sensitivities for RF Subencoding Acquisition Techniques", Proceedings of the International Society for Magnetic Resonance in Medicine, 9th Scientific Meeting and Exhibition, Glasgow, Scotland, UK, Apr. 21–27, 2001, p. 799, XP002277679.

* cited by examiner

*Primary Examiner*—Brij Shrivastav
*Assistant Examiner*—Tiffany A. Fetzner
(74) *Attorney, Agent, or Firm*—Nixon & Vanderhye P.C.

(57) ABSTRACT

A sensitivity distribution is estimated for a multicoil used in multicoil fast imaging. Initial sensitivity maps M1 to M3 are produced respectively from images C1 to C3 acquired from the plurality of RF coils in the multicoil. By fitting TPS (thin-plate splines) to the initial sensitivity maps M1 to M3 used as target data, sensitivity maps M1' to M3' for unfolding are estimated. In fitting the TPS, functions are activated, such as automatic arrangement of control points, addition of target points to the outside of an image, use of a known model, and fitting to at least either absolute value components of MR data or phase components of the MR data. Thus, even if only coarse echo data is acquired from the region to be imaged, a sensitivity map of each element coil of the multicoil is estimated with high precision.

13 Claims, 15 Drawing Sheets

KNOWN MODEL (PRIOR MODEL):

WITHOUT KNOWN MODEL (WITHOUT PART OF DATA):

WITH KNOWN MODEL:

PARALLEL MR IMAGING USING HIGH-PRECISION COIL SENSITIVITY MAP

TECHNICAL FIELD OF THE INVENTION

The present invention relates to magnetic resonance imaging (MRI) and in particular, to a method and apparatus for estimating RF coil sensitivity distributions necessary for performing fast MR imaging (parallel MR imaging) with a multicoil composed of a plurality of coil elements.

BACKGROUND ART

Magnetic resonance imaging is an imaging technique that magnetically excites nuclear spins of an object placed in a static magnetic field with the use of an RF signal at the Larmor frequency for the spins, acquires an MR signal emanated in response to the excitation, and reconstructs an image from the MR signal.

In the field of MR imaging, fast imaging techniques have been researched actively in recent years. As one example, there has been known fast imaging which is generically called parallel MR imaging using a plurality of RF coils. This parallel MR imaging technique has also been referred to, from a historical viewpoint, as a multicoil fast imaging technique, PPA (Partially Parallel Acquisition) technique, or subencoding technique.

This parallel MR imaging technique has been executed in various modes. In the initial stage, there were provided modes proposed by papers, for instance, "Carlson J. W. and Minemura T., Image Time Reduction Through Multiple Receiver Coil Data Acquisition and Image Reconstruction, MRM 29:681–688, 1993" and "Ra J. B. and Rim C. Y., Fast Imaging Using Subencoding Data Sets From Multiple Detectors, MRM 30:142–145, 1993."

There have been many techniques which have been upgraded from the initial ones. Among such upgraded techniques, included is a SMASH technique known by a paper "Sodikson D. K. and Manning W. J., Simultaneous Acquisition of Spatial Harmonics (SMASH): Fast Imaging with Radiofrequency Coil Arrays, MRM 38:591–603, 1997" and a SENSE technique known by a paper "Pruessman K. P., Weiger M., Scheidegger M. B., and Boesiger P., SENSE: Sensitivity Encoding for Fast MRI, MRM 42:952–962, 1999."

These types of parallel MR imaging techniques require a fundamental imaging configuration, in which, what is called a multicoil composed of a plurality of RF coils (element coils) is used to receive echo signals from the RF element coils simultaneously and to produce image data from the echo signal received from each RF element coil. On condition that the plurality of RF coils provide simultaneous reception, the number of encoding times assigned to each RF coil is reduced down to a value obtained by dividing "a predetermined number of encoding times necessary for image reconstruction" by "the number of RF element coils." This encoding technique leads to a smaller FOV for each image produced by an RF element coil, so that scan time is reduced, while the above encoding causes wrap-around or folding phenomena at the ends of each image.

FIG. 1 shows examples of images acquired by the parallel MR imaging technique under the condition of "the number of element coils=2." Pictures (a) and (b) in FIG. 1 illustrate images acquired from different element coils, respectively.

In the parallel MR imaging technique, the fact that a plurality of RF coils each have different sensitivity distributions is used for post-processing, that is, unfolding processing for plural images. The unfolded plural images are processed into a final full-FOV (field of view) image. The unfolding processing makes use of spatial sensitivity maps for each of the RF coils (element coils). In this way, parallel MR imaging provides fast scanning (fast imaging) and provides a wide field-of-view final image, such as an image covering the whole abdominal region.

The sensitivity maps are required to be obtained before a main scan each MR imaging time. Practically, image data acquired by a pre-scan (preparation scan) is subjected to predetermined calculation so that the sensitivity data can be obtained. The thus-obtained sensitivity data then undergoes low-pass filtering or polynomial fitting processing, with the result that sensitivity maps for unfolding processing can be provided. In this calculation, at least either an interpolation method or an extrapolation method may be usable.

However, a region where echo signal sources are abundantly present provides large amounts of sensitivity information (i.e., echo signals) about each RF element coil, but a region where there are few echo signal sources, such as a region outside an object to be examined and the pulmonary region of the object, provides only a small amount of sensitivity information about each RF element coil. Thus, it is difficult to apply the foregoing low-pass filtering and polynomial fitting processing to an image acquired from a region where the density of echo data (original data) sources to be acquired is coarse. In addition, if it is desired to adopt the extrapolation method, the spatial range in an acquired image to which the extrapolation method is applicable is smaller, thus frequently a difficult situation is faced where sensitivity distribution data cannot be expanded with precision.

Further, when applying low-pass filtering or polynomial fitting processing to an acquired image, a peripheral portion of the image frequently shows abnormal diverging data, thus making it difficult to obtain a smooth and stable sensitivity map.

As a result, the unfolding processing should be performed with the use of a sensitivity map which is lower in both precision and smoothness, resulting in artifacts that still remain in the full-FOV synthesized image finally obtained. The image has a deteriorated quality and is low in a depiction performance.

SUMMARY

One Aspect object of the present invention is to provide, with due consideration to drawbacks of the above conventional configurations, a technique for estimating each of the sensitivity maps for a plurality of element coils in a multicoil with high precision, even when only coarse echo data is acquired from the region to be imaged (i.e., the imaging region includes a region where no echo signal is acquired at all or only echo signals of lower values are acquired). Another aspect of the present invention is to provide a magnetic resonance imaging apparatus that has such an estimation function.

In order to the above objects, there is provided a coil sensitivity distribution estimating apparatus that includes: production means for producing an initial sensitivity map of a multicoil; and fitting means for obtaining an unfolding sensitivity map by fitting GCS (Global Coverage Splines) to the initial sensitivity map.

For instance, the production means can be formed into means for producing the initial sensitivity map by synthesizing (by using processing such as sum-of-squares) pixel values of images acquired respectively by the plurality of RF element coils. Alternatively, the production means can be formed into means for using, as the initial sensitivity map, an image acquired using a whole-body coil.

In addition, by way of example, the fitting means may have means for performing processing composed of at least one of automatic positioning of a basis function of the GCS, external addition of a target point to an image in performing the unfolding processing, and embedding known information about the sensitivity map for the unfolding processing. In this case, an example is that the fitting means may have means for performing automatic positioning of the basis function of the GCS, wherein the performance means is formed into means for automatically positioning a grid in which grid points thereof become control points.

A further preferred example is that the production means and the fitting means can be configured to apply both the production of the initial sensitivity map and the processing to obtain the sensitivity map to at least one of absolute value components of MR data and phase components of the MR data.

A coil sensitivity distribution estimating method according to one aspect of the present invention is a method for estimating a sensitivity distribution of a multicoil. This method is characterized in that the method includes producing an initial sensitivity map of the multicoil, and obtaining an unfolding sensitivity map by fitting GCS to the initial sensitivity map.

As another mode of the magnetic resonance imaging apparatus according to the present invention, the apparatus may be provided to obtain an MR image of an object to be examined using a multiple coil and having first production means for producing first sensitivity maps of the RF coils, respectively, on the basis of echo data received from the plurality of RF coils of the multicoil and acquired from a pre-scan; second production means for producing second sensitivity maps by fitting GCS (Global Coverage Splines) to the first sensitive maps, respectively; reconstruction means for reconstructing echo data scanned by parallel MR imaging and received via the plurality of RF coils of the multicoil; and image obtaining means for obtaining an MR image by processing an image reconstructed by the reconstruction means, the processing including unfolding processing carried out using the second sensitivity maps.

By way of example, the first production means may include scanning means for obtaining volume data made up of three-dimensional echo data by performing the pre-scan and calculation means for calculating, as the first sensitivity map, a first three-dimensional sensitivity map for each RF coil on the basis of a whole body volume coil, and the second production mans is formed into means for fitting the GCS to each three-dimensional first sensitivity map to obtain, as the second sensitivity map, a second three-dimensional sensitivity map. In this configuration, the image obtaining means comprises cutting means for cutting out a sectional sensitivity map from the second three-dimensional sensitivity map depending on the image reconstructed by the reconstruction means and unfolding means for performing the unfolding processing with the use of the sectional two-dimensional map cut out by the cutting means.

Still another mode of the magnetic resonance imaging apparatus according to the present invention is such that a magnetic gradient and a radio frequency signal is applied to an object to be examined placed in a static magnetic filed in accordance with a parallel MR imaging technique, an MR (magnetic resonance) signal emanating from the object is received by a multicoil composed of a plurality of element coils, and the MR signal received by the individual element coils is subjected to imaging. The apparatus is characterized by having a receiver configured to receive and process each of the MR signals individually received by the plurality of element coils so that reception signal is produced; and a calculator configured to have the functions of: producing an initial sensitivity map of the multicoil from a plurality of sets of reception data produced individually from the receiver through a preparation scan; fitting GCS (Global Coverage Splines) to the initial sensitivity map to obtain an unfolding sensitivity map; and producing an image based on the first imaging technique using a plurality of sets of reception data produced individually from the receiver through an imaging scan and the unfolding sensitivity map.

Accordingly, final sensitivity maps can be obtained by fitting the GCS to initial sensitivity maps. Thus, unlike the conventional refine techniques of using a simple low-pass filter and a local polynomial fitting method, unfolding sensitivity maps of a plurality of element coils composing a multicoil can finally be estimated individually with higher precision, even if a region to be imaged includes a region from which only coarse echo data is acquired (i.e., echo signals are cannot be acquired at all or only lower-value echo signals can be acquired). This estimation can be executed by using a two-dimensional GCS fitting or three-dimensional GCS fitting.

The GCS (Global Coverage Splines) is enough if it can be applied to fitting of a wide area, and includes TPS (Thin-Plate Splines), B-splines, and Bezier Surfaced. The synthesis processing can be executed in the form of, for example, a square root of sum-of-squares (abbreviated as sum-of-squares (SoS)) operation or a simple sum operation.

The coil sensitivity estimation technique according to the present invention can also be applied to correction of coil sensitivities in imaging using a phased array coil (PAC) (that is, imaging different from the parallel MR imaging).

DETAILED DESCRIPTION OF EXEMPLARY EMBODIMENTS

Figure 1:
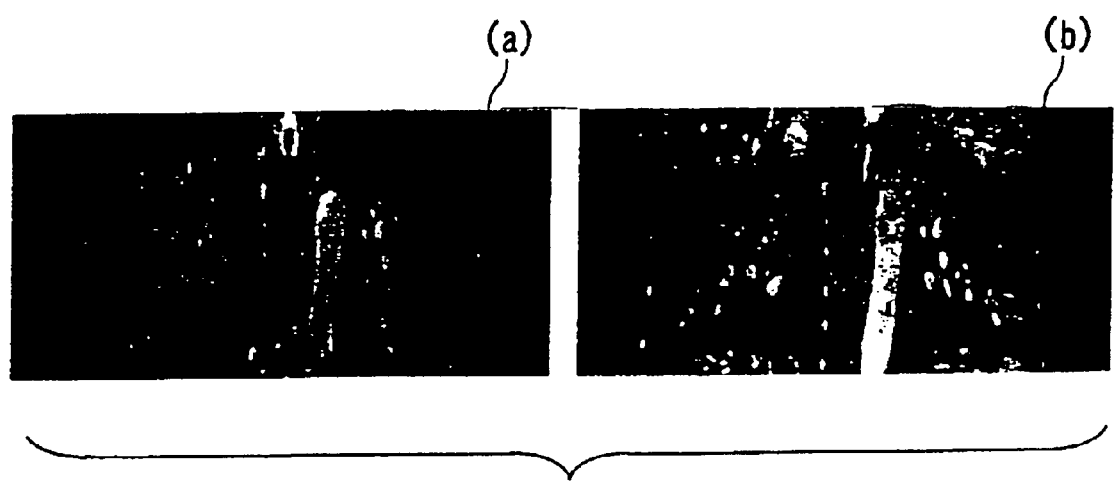
FIG. 1 exemplifies conventional images (shown by pictures) obtained by parallel MR imaging that is one mode of the multicoil fast imaging techniques.

In connection with the accompanying drawings, an embodiment of the present invention will now be explained.

First, referring to FIG. 2, an MRI (magnetic resonance imaging) apparatus according to the present embodiment will now be explained. In the MRI apparatus, a coil-sensitivity distribution estimating apparatus according to the present invention is functionally reduced into practice.

The present MRI apparatus is configured to perform fast imaging with the use of a multicoil so that an image on parallel MR imaging (also referred to as PPA (partial parallel acquisition)) is obtained. As shown in FIG. 2, the MRI apparatus is provided with a couch unit on which a patient P as an object to be imaged is laid, a static magnetic field generating unit for generating a static magnetic field, and a gradient generating unit for adding positional information to the static magnetic field, a transmission/reception unit for transmitting and reception RF signals, and a control/calculation unit in charge of control of the entire system and image reconstruction.

The static magnetic generation unit is proved with a magnet 1 constructed by employing for example a superconducting magnet and a static power supply 2 supplying current to the magnet 1. By these devices, a static magnetic field Ho is produced in an axial direction of a cylindrical bore (a space for diagnosis) into which the object P is inserted. In the orthogonal coordinate axes assigned to the apparatus, such axial direction agrees with the Z-axis direction. In addition, this generation unit is provided with a not-shown shimming coil for shimming the static magnetic field.

The couch unit is configured in such a manner that a tabletop 14T on which the object P is laid can be inserted and returned into and from the bore of the magnet 1. A couch driver 14D performs this insertion and return. The couch driver 14D responds to a drive signal given by a host computer 6 later described so as to move the tabletop 14T along its longitudinal direction (i.e., the Z-axis direction). The object P is laid on the tabletop 14T along its longitudinal direction, for example.

The gradient generating unit has a gradient coil unit 4G incorporated in the magnet 1. The gradient coil unit 4G includes three sets (types) of x-, y-, and z-coil for generating X-, Y-, and Z-directional gradient magnetic fields (gradients) that are orthogonal among themselves. The gradient generating unit further includes a gradient amplifier 4 to supply currents to each of the x-, y-, and z-coils. The gradient amplifier 4 supplies those coils with pulsed currents to generate gradients under the control of a sequencer 5 later described.

Controlling pulsed currents supplied from the gradient amplifier 4 to the x-, y-, and z-coils enables the mutually-orthogonal X-, Y-, and Z-directional gradients, which are gradients in the physical axes, to be synthesized. Thus mutually-orthogonal logic directional gradients, i.e., a slice gradient Gs, phase-encode gradient Ge, and read-out (frequency encoding) gradient Gr can be set or changed in an arbitrary way. The gradients in the slice, phase-encode, and read-out directions are superposed on the static field $H_0$.

The transmission/reception unit includes not only a whole-body (WB) coil 7T and a multicoil 7R, both of which are RF coils, but also a transmitter 8T and a receiver 8R both connected to the coils 7T and 7R. The coils 7T and 7R are disposed in the vicinity of the object P in the space for diagnosis formed within the bore of the magnet 1.

The whole-body coil 7T is used in common for transmission and reception in cases where only the coil 7T is employed as the RF coil. On the other hand, when employing the multicoil coils 7R (serving as a reception coil), the whole-body coil 7T is used as a transmission coil.

The multicoil 7R, formed as an array type of coil to which a high S/N ratio can be given, is composed of a plurality of RF coils (for instance, surface coils) serving as element coils. The plural RF coils 7a to 7c are disposed in an imaging space, for example, along the Z-axis direction and electrically connected to the receiver 8R via mutually independent paths.

In the present invention, the multicoil 7R is not always restricted to the structure of a plurality of surface coils, but may be structured to have a plurality of volume coils. In addition, the multicoil may be attached to the patient couch or an object to be imaged.

Both the transmitter 8T and the receiver 8R are operative under the control of a sequencer 5 later described. The transmitter 8T supplies, to the whole-body coil 7T, RF pulse currents of which frequency is set to a Larmor frequency to cause nuclear magnetic resonance (NMR) of magnetic spins in the object P. On the other hand, the receiver 8R accepts an echo signal (RF signal) received by the whole-body coil 7T or the multicoil 7R, and then produces the signal into echo data (raw data).

Figure 2:
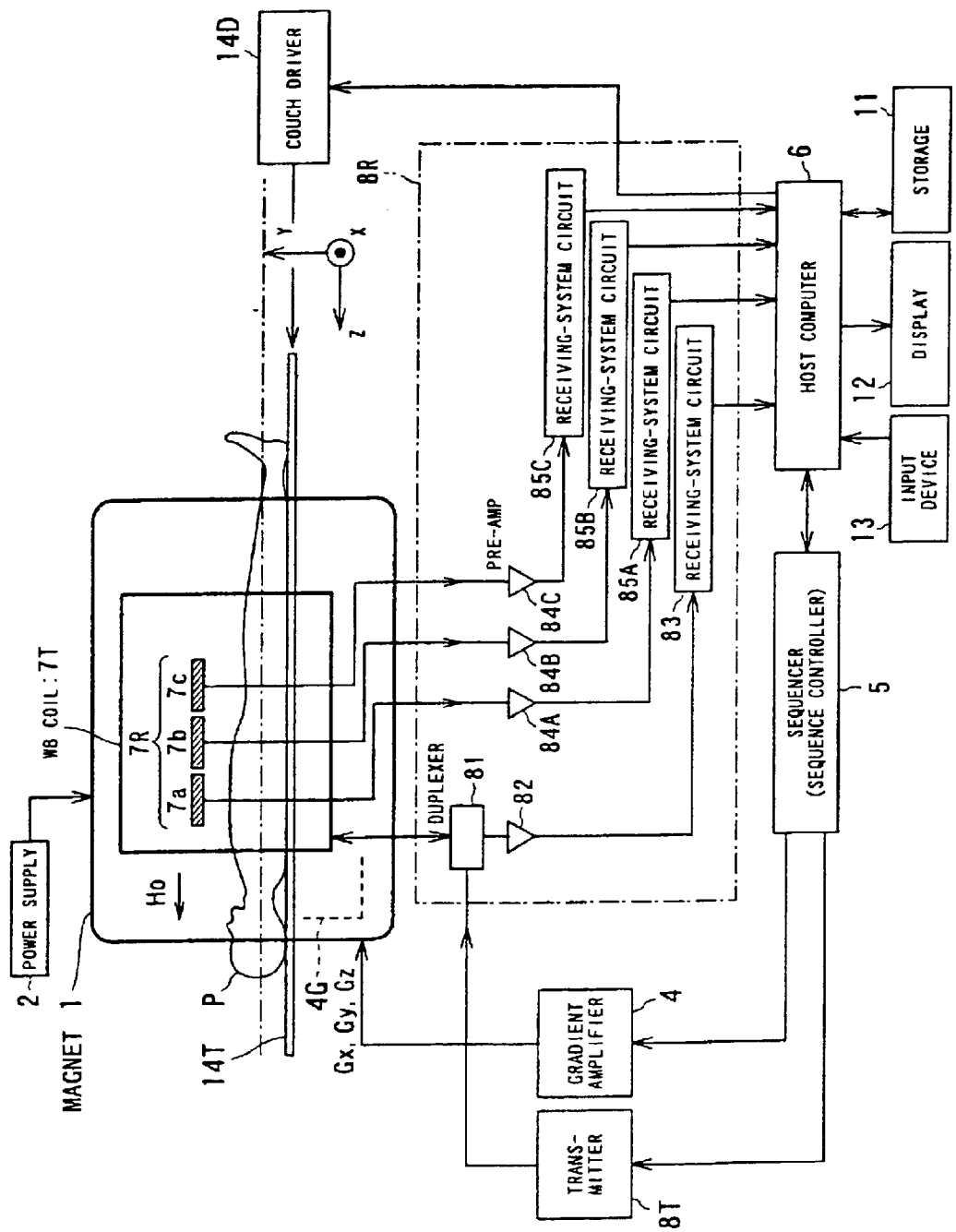
FIG. 2 is a functional block diagram exemplifying the configuration of an MRI apparatus (functionally includes a coil-sensitivity distribution estimating apparatus) according to an embodiment of the present invention.

The receiver 8R is divided, specifically, as shown in FIG. 2, into a reception part for the whole-body coil side and a further reception part for the multicoil side.

The reception part for the whole-body coil side includes a duplexer 81 connected with the whole-body coil 7T, a preamplifier 82 connected to the duplexer 81, and a receiving-system circuit 83 receiving a reception signal from the preamplifier 82. The duplexer 81 is coupled with the transmitter 8T as well.

This connection permits the duplexer 81 to pass a transmission drive pulse from the transmitter 8T to the whole-body coil 7T in transmission, while to pass an echo signal detected by the whole-body coil 7T to the preamplifier 82 in reception. The preamplifier 82 pre-amplifies the received echo signal to send the amplified signal to the receiving-system circuit 83. This circuit 83 performs various types of signal processing on the inputted echo signal, the processing including intermediate frequency conversion, phase detection, low-frequency amplification, and filtering. Then, the processed signal is subject to A/D conversion to produce echo data (raw data), before being sent to the host computer 6.

On the other hand, the reception part for the multicoil side is provided with preamplifiers 84A to 84C receiving echo signals from the multicoil 7R, every RF coil 7a (to 7c). The output line from each preamplifier 84A (to 84C) is routed to a host computer 6 via each of receiving-system circuits 85A (to 85C). In the similar way to the above, each of the receiving-system circuits 87A to 87C executes various types of processing, such as intermediate frequency conversion, phase detection, low-frequency amplification, and filtering, on the inputted echo signal, A/D-converts the processed echo signal to produce echo data, and then sends the converted one to the host computer 6.

Moreover, the control/calculation unit includes a sequencer 5 (also referred as sequence controller), host computer 6, storage 11, display 12, and input device 13.

The host computer 6 provides the sequencer 5 with pulse sequence information indicative of a preparation scan (pre-scan) and an imaging scan on the basis of procedures on software stored in its inner memory or the storage 11 and controls the operations of the entire system. Additionally, the host computer 6 has various other functions of estimating sensitivity maps of RF coils 7a to 7c of the multiple coil 7R, calculating image data through reconstruction processing of echo data, and controlling the drive of the couch driver 14D. The host computer 6 also functions as a calculator according to the present invention.

The imaging scan is carried out based on the pulse sequence information in order to acquire sets of echo data necessary for image reconstruction. The pulse sequence can be formed as either a three-dimensional (3D) scan sequence or a two-dimensional (2D) scan sequence. Pulse train modes applicable to the pulse sequence are based on an SE (spin echo) method, FSE (fast spin echo) method, FASE (fast asymmetric SE) method (that is, the FSE method combined with a half-Fourier method), EPI (echo planar imaging) imaging, FE (gradient field echo) method, FFE (fast FE) method, and segmented FFE method.

The sequencer 5 has a CPU and memories and memorizes pulse sequence information sent from the host computer 6. Based on this information, the sequencer 5 controls the operations of the gradient amplifier 4, transmitter 8T, and receiver 8R. The pulse sequence information is all kinds of information necessary for operating the gradient amplifier 4, transmitter 8T, and receiver 8R according to a series of pulse trains in a pulse sequence. For instance, the pulse sequence information includes pieces of information concerning magnitudes of pulse currents applied to the x-, y-, and z-coil, periods of time of application of pulses, and application timings of the pulses.

In the multicoil fast imaging, data of reconstructed images and data of synthesized images are displayed on the display 12 and stored in the storage 11. Various types of information, such as imaging conditions, a pulse sequence, an image synthesis technique, and a difference calculation technique, which are desired by an operator, are transmitted to the host computer 6 via the input device 13.

The operations and advantages of the present embodiment will now be described, in which the production of sensitivity maps of the multicoil 7R will be spotlighted primarily.

Figure 3:
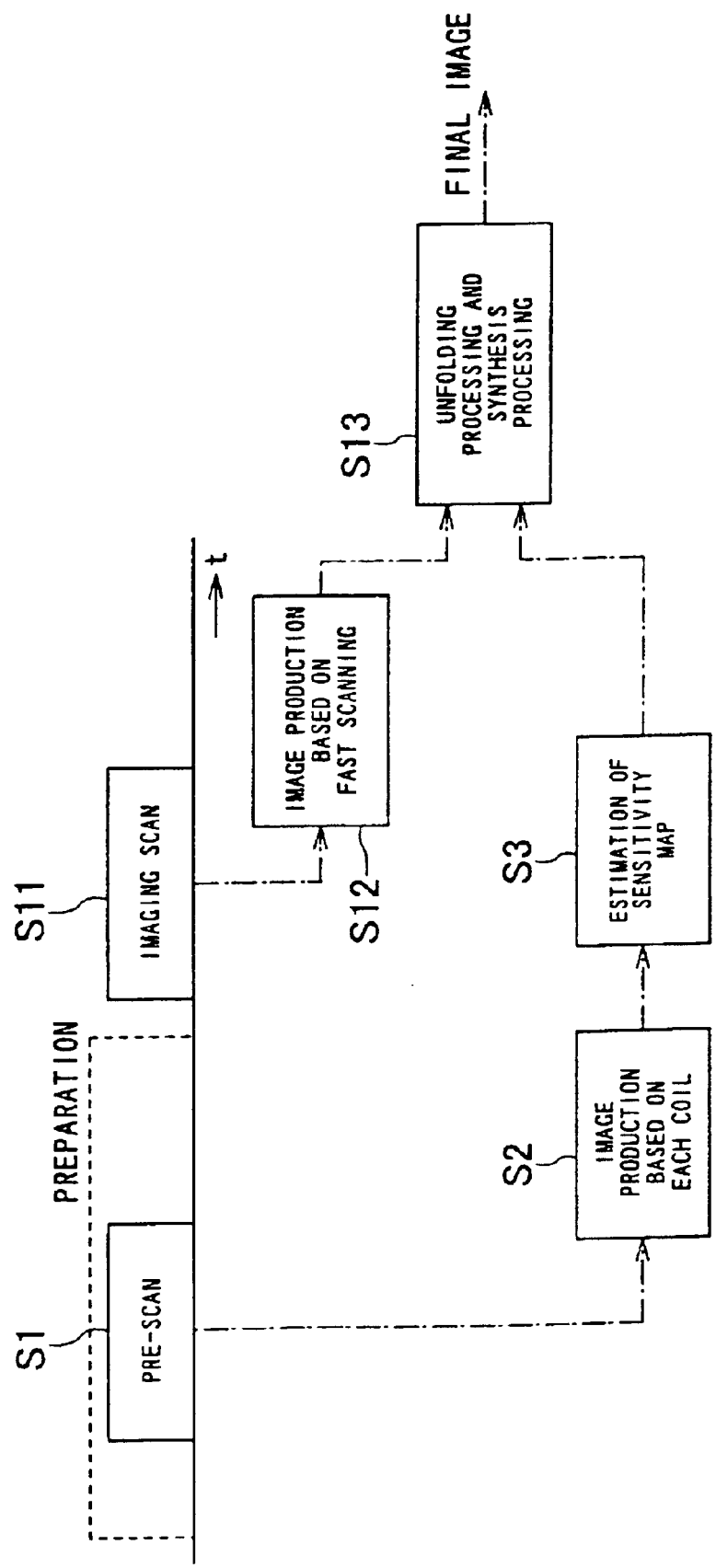
FIG. 3 is an illustration outlining procedures for obtaining a final full-FOV MR image in the parallel MR imaging.

In the present embodiment, the fast imaging with the use of the multicoil is carried out based on the procedures decided as outlined in FIG. 3.

First, as one step of preparation work before an imaging scan, a pre-scan is carried out based on a predetermined pulse sequence, which is able to estimate a sensitivity map of each RF coil of the multicoil 7R (step S1). This pre-scan is carried out every RF coil 7a (to 7c) using a fast pulse sequence based on, for example, a two-dimensional FFE (Fast Field Echo) method, so that echo signals needed for image reconstruction are acquired.

Figure 4:
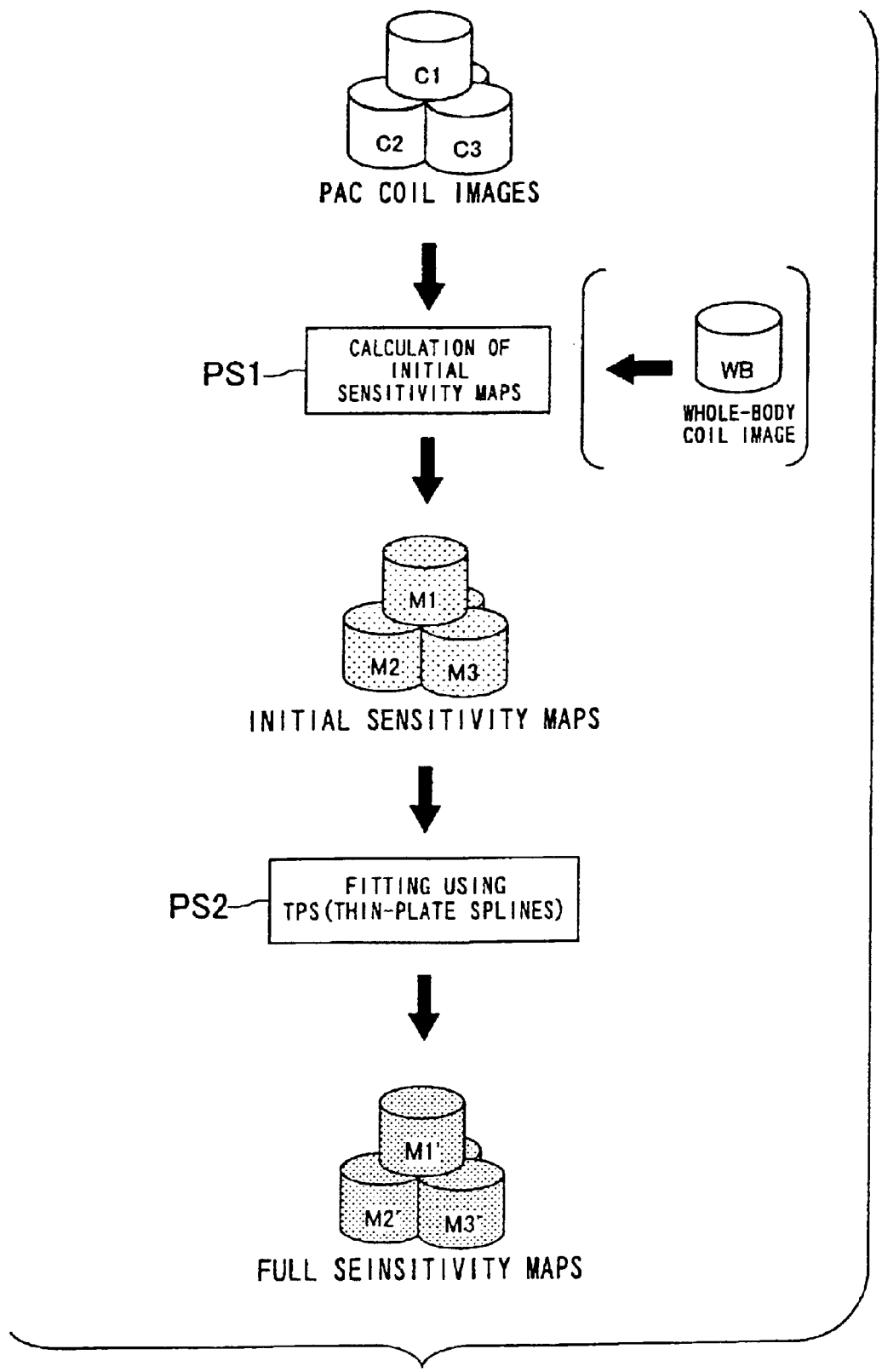
FIG. 4 is a flowchart outlining procedures for estimating sensitivity maps used for unfolding processing.
Figure 5:
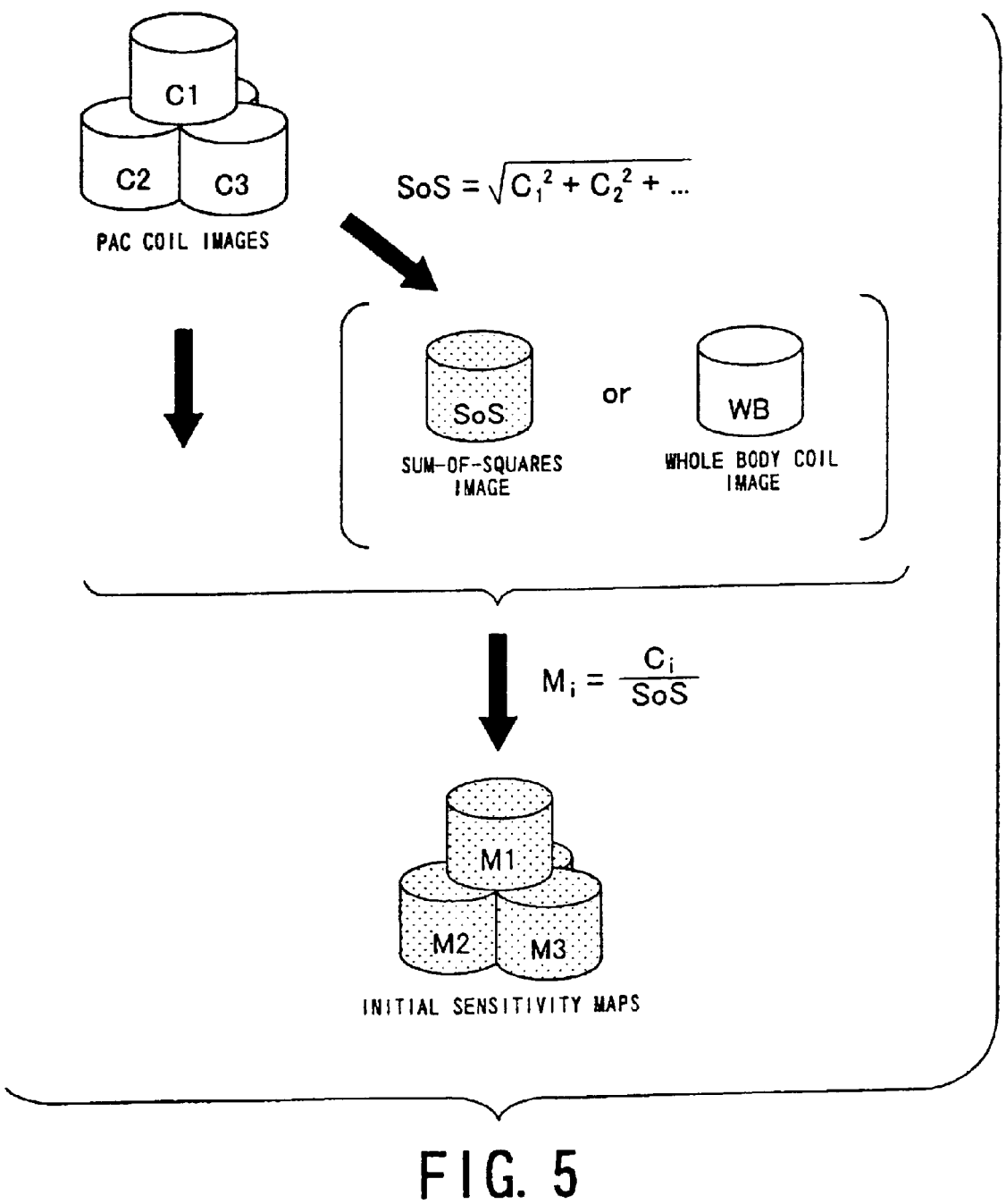
FIG. 5 is a chart showing outlined procedures for calculating initial sensitivity maps.

Echo data acquired in the pre-scan and processed by the receiver 8R are sent to the host computer 6, where the echo data is reconstructed into real-space images C1 and C3, every RF coil (step S2: refer to FIGS. 4 and 5). Then the host computer 6 uses the images C1 to C3 to estimate, as will be described later, individual sensitivity maps M1' to M3' of the RF coils 7a to 7c composing the multicoil 7R (step S3: refer to FIG. 4). The data of such sensitivity maps are preserved in the storage 11.

On the other hand, echo data acquired in an imaging scan (step S11) and processed by the receiver 8R is sent to the host computer 6 as well, where the echo data are reconstructed, every RF coil, into real-space images (step S12). The images are subjected, correspondingly to each RF coil, to unfolding processing using the sensitivity maps of the RF coils 7a to 7c, which are read out from the storage 11, and then synthesized into a final full-FOV image (step S13).

Referring to figures starting from FIG. 4, the foregoing processing for estimating the sensitivity maps (step S3) will now be detailed.

The estimation of the sensitivity maps is executed by the host computer 6. Specifically, as shown in FIG. 4, the estimation processing includes the step PS1 of individually calculating initial sensitivity maps M1 to M3 from plural images C1 to C3 (referred to as coil images) acquired individually from the plural RF coils 7a to 7c; and the step PS2 of estimating full sensitivity maps M1' to M3' by fitting TPS (Thin-Plate Splines) according to the present invention to the initial sensitivity maps M1 to M3. The full sensitivity maps M1' to M3' become sensitivity distributions of element coils, which are finally used for unfolding processing.

(Calculation of Initial Sensitivity Maps)

Referring to FIG. 5, how to calculate the initial sensitivity maps will now be described.

This calculation is carried out on absolute value data and/or phase data of each of the coil images C1 to C3 which has been obtained correspondingly to the RF coils 7a to 7c. As a result of it, initial sensitivity maps resulting from the absolute values and/or phases of each of the coil images C1 to C3 can be produced. Hereinafter, the calculation of those initial sensitivity maps will be abbreviated simply as "calculation of sensitivity maps."

This calculation of sensitivity maps is relatively easier and has been proposed by the foregoing SENSE technique, for example. That is, the coil images C1 to C3 obtained depending on the RF coils 7a to 7c (i.e., the number of element coils=3) composing a phased array coil (PAC) are subjected to the calculation for a sum-of-squares (SoS) image, that is, the calculation based on the following formula for synthesis.

$$SoS = (C1^2 + C2^2 + C3^2)^{1/2} \quad (1a)$$

Then, as to each pixel value of each of the coil images C1 to C3, the calculation based on $$Mi = Ci/SoS \quad (2a)$$

is performed to figure out initial sensitivity maps M1 to M3, respectively, in which i=1 to n (n is a positive integer: n=3 in this situation). This division allows anatomical structures to be removed from the images, whereby there are provided images in which sensitivity profiles of the coils are reflected well.

The calculation for obtaining the sensitivity map of each of the coils is allowed at only positions that provide echo signals of which intensities are fully high. In other words, signal-intensity-lower positions on a SoS image will provide no sensitivity information. Such positions can be detected by using, for example, a threshold of 10 percents which is a ratio between a maximum intensity and an entire intensity.

Another method of obtaining the SoS image is to employ an image imaged by the whole-body (WB) coil 7T. In the case of using the WB coil 7T, there is an advantage that the sensitivity map can be provided with high precision. However, in this case, it is essential that there is a positional shift (misregistration) between the WB coil and the multicoil (i.e., both the coils are positionally consistent with each other).

Figure 6:
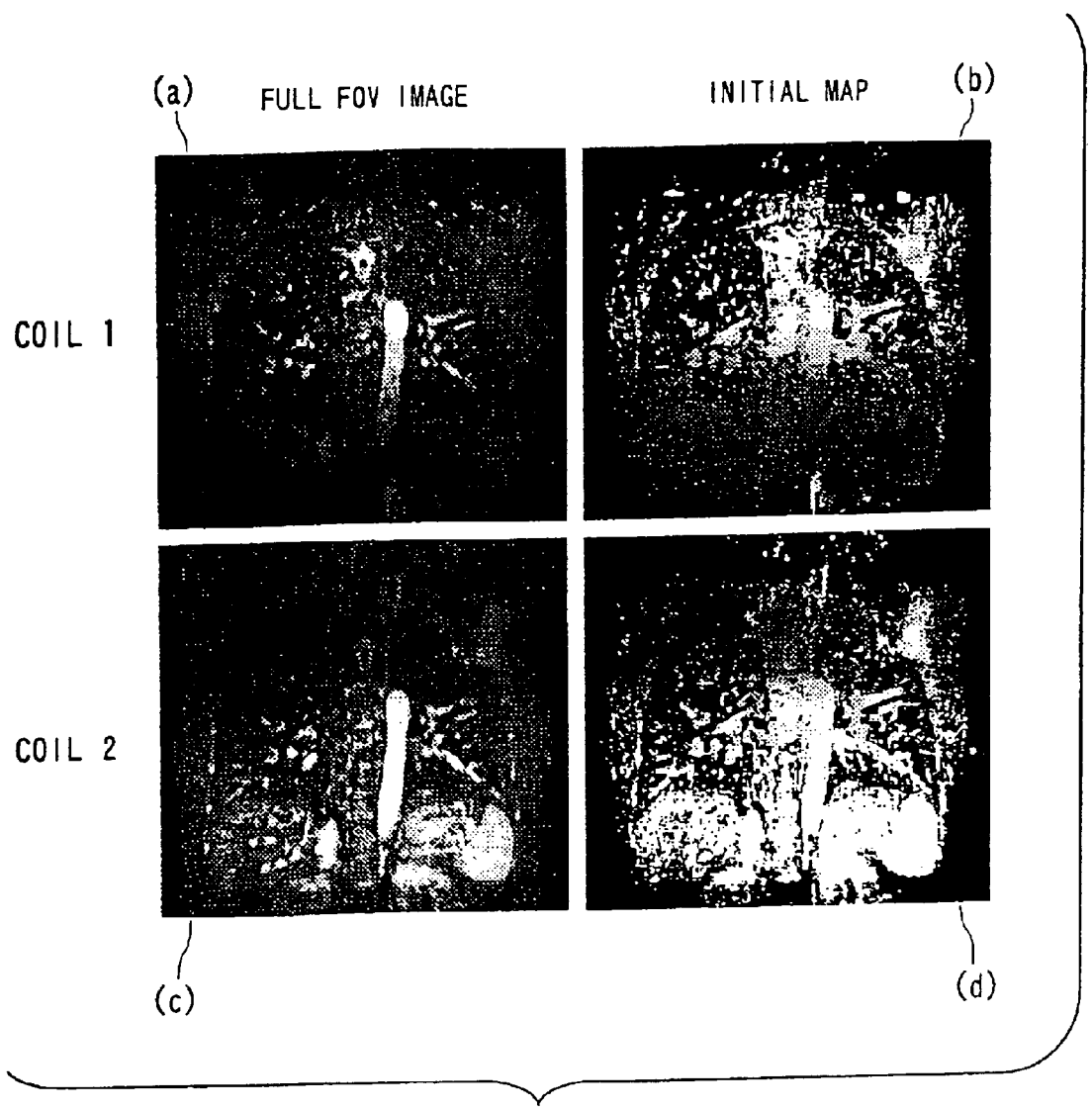
FIG. 6 exemplifies full-FOV images (shown by pictures) each serving as a coil image and initial sensitivity maps (shown by pictures) produced from the full-FOV images.

FIG. 6 exemplifies full-FOV images (upper left and lower left images: refer to FIGS. 6(a) and (c)) and initial sensitivity maps (upper right and lower right images: refer to FIGS. 6(b) and (d)) calculated from the fill-FOV images, respectively, there images being experimentally acquired from two RF coils (element coils 1 and 2).

(TPS Fitting)

The fitting processing (FIG. 4, step PS2) will now be described.

First of all, TPS (Thin-Plate Splines) will now be explained. The TPS are curved surfaces defined as combinations of basis functions depending on logarithm. Such basis functions can be curved locally, so that combining the basis functions allows the entire shape of a curved surface to be decided uniquely.

A set of basis functions is defined by specifying both of their positions (a representative position defined by a central point surrounded by the basis functions; hereinafter referred to control point) and their heights (defined by weighting coefficients given in formulas for the TPS).

Figure 7:
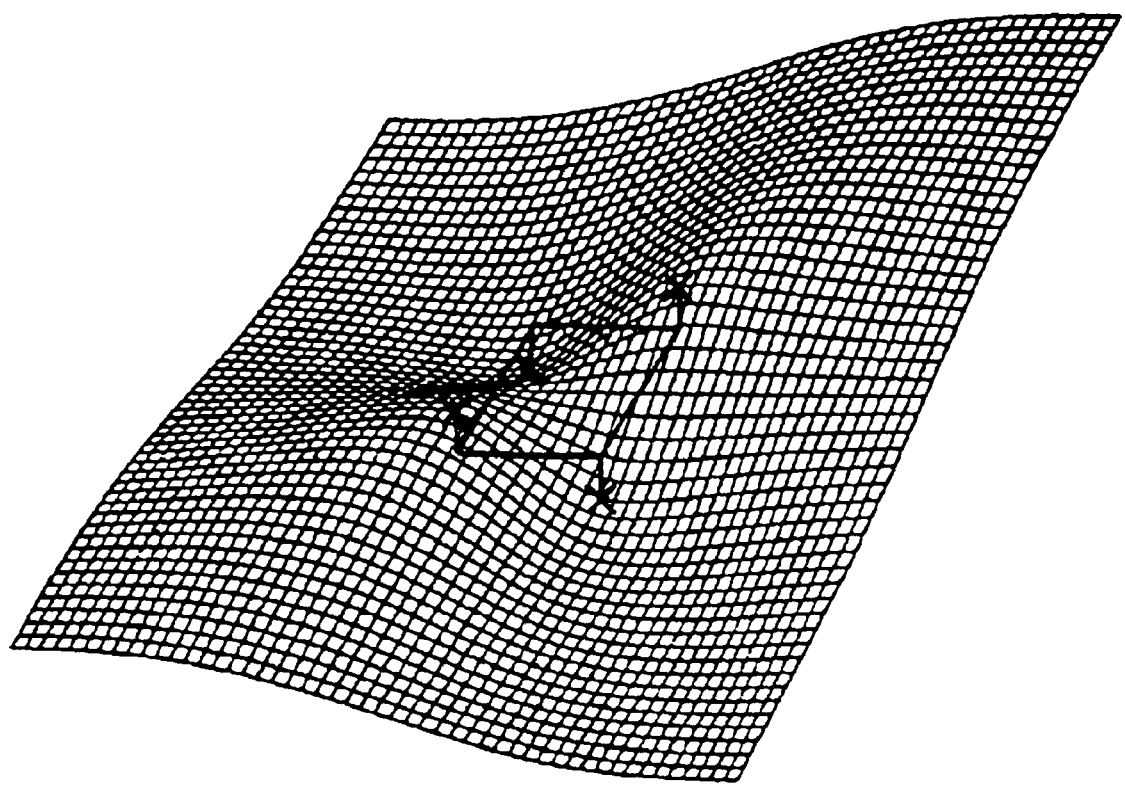
FIG. 7 illustrates one example of TPS.

FIG. 7 exemplifies the TPS. In this example, the control points are assigned to the vertices of a rhombus, in which the heights of those vertices are expressed by the "x" marks. In this way, combining plural basis functions with each other permits the entire shape of any curved surface to be identified as being a surface that passes all the "x" marks.

(General TPS Fitting)

The fitting based on the TPS, which has been for general use, will now be described (in terms of both of an interpolation and approximate techniques).

The TPS is expressed by adding a boundary condition to a combination of bending functions, which can be expressed by the following formula (1):

$$S(x, y) = \sum_{i=1}^{n} w_i F_i(x, y) + a + bx + cy, \tag{1}$$

wherein $$F_i(x, y) = d_i^2 \log d_i^2, \quad d_i = \sqrt{(x-x_i)^2 + (y-y_i)^2}, \tag{2}$$

wherein wi denotes weight coefficients and a+bx+c is a term to provide a smoothness at the boundary.

As for the interpolation technique, a system interpolating a series of points accurately will now be explained. By the way, in the most generalized case, a large amount of data points can be used, so that, in such a case, the approximate technique is more advantageous than the interpolation technique. As the approximate technique, a technique of fitting the TPS on the basis of the least squares method.

<In the Case of Interpolation Technique>

When target data to be interpolated is $S(x_k, y_k)$ (k=1, ..., n), a system to be solved is:

$$\begin{cases} \sum_{i=1}^{n} w_i F_i(x_k, y_k) + a + bx_k + cy_k = S(x_k, y_k), k = 1 \cdots n \\ \sum_{i=1}^{n} w_i = 0 \\ \sum_{i=1}^{n} w_i x_i = 0 \\ \sum_{i=1}^{n} w_i y_i = 0 \end{cases} \tag{3}$$

If rewritten into a matrix notation, the target data can be expressed as follows.

$$\begin{bmatrix} S(x_1, y_1) \\ S(x_2, y_2) \\ \vdots \\ S(x_n, y_n) \\ 0 \\ 0 \\ 0 \end{bmatrix} = \tag{4}$$

$$\begin{bmatrix} 0 & F_2(x_1, y_1) & \cdots & F_n(x_1, y_1) & 1 & x_1 & y_1 \\ F_1(x_2, y_2) & 0 & \cdots & F_n(x_2, y_2) & 1 & x_2 & y_2 \\ \vdots & \vdots & \vdots & \vdots & \vdots & \vdots & \vdots \\ F_1(x_n, y_n) & F_2(x_n, y_n) & \cdots & 0 & 1 & x_n & y_n \\ 1 & 1 & \cdots & 1 & 0 & 0 & 0 \\ x_1 & x_2 & \cdots & x_n & 0 & 0 & 0 \\ y_1 & y_2 & \cdots & y_n & 0 & 0 & 0 \end{bmatrix} \begin{bmatrix} w_1 \\ w_2 \\ \vdots \\ w_n \\ a \\ b \\ c \end{bmatrix}$$

This matrix notation can also be expressed as:

$$S = FW, \tag{5}$$

the weighting coefficients can be expressed by a generalized form as follows.

$$W = F^{-1}S \tag{6}$$

<Least Squares Approximation>

The TPS can be approximated as follows:

$$S(x, y) \approx \sum_{i=1}^{m} w_i F_i(x, y), \tag{7}$$

wherein m denotes the number of basis functions, which is smaller than the number n of data points (i.e., m<n). An approximate error on this approximation can be expressed as follows.

$$\varepsilon^2 = \sum_{k=1}^{n} \left( S(x_k, y_k) - \sum_{i=1}^{m} w_i F_i(x_k, y_k) \right)^2 \tag{8}$$

When an error with regard to the parameter $w_i$ is minimized, a formula of:

$$0 = \sum_{k=1}^{n}\left(S(x_k, y_k) - \sum_{i=1}^{m} w_i F_i(x_k, y_k)\right) F_j(x_k, y_k), \quad j = 1 \cdots m \quad (9)$$

can be obtained.

A design matrix A and an observation vector s are defined as follows:

$$A = \begin{bmatrix} F_1(x_1, y_1) & F_2(x_1, y_1) & \cdots & F_m(x_1, y_1) \\ F_1(x_2, y_2) & F_2(x_2, y_2) & \cdots & F_m(x_2, y_2) \\ \vdots & \vdots & \vdots & \vdots \\ F_1(x_n, y_n) & F_2(x_n, y_n) & \cdots & F_m(x_n, y_n) \end{bmatrix} \quad (10)$$

$$s = [S(x_1, y_1) S(x_2, y_2) \ldots S(x_n, y_n)]^T \quad (11)$$

This gives an approximation formula based on the least squares technique as follows:

$$(A^T A) w = A^T s \quad (12)$$

Thus, a solution to the problem on this least squares technique can be obtained as a pseudo inverse matrix of the design matrix A, which is as follows:

$$w = (A^T A)^{-1} A^T s \quad (13)$$

The TPS can be use when the data positions are interpolated or approximated and have both theoretical and practical characteristics.

Theoretically, the TPS can be defined as a curved surface selected from all kinds of curved surfaces passing a set of points so that the selected curved surface minimizes an amount of bending energy. In terms of practical use, the TPS can be expressed by a linear formula, with the result that the calculation can be facilitated and speeded up. Further, the number and positions of basis functions (i.e., control points) can be selected without any limitations, thus providing a flexible fitting technique.

Originally, the formulas for the TPS were introduced by Harder and Desmarais (refer to the paper "Harder R. L. and Desmarais R. N., Interpolation using surface splines, Journal of Aircraft 9:189–191, 1972"). An application of the TPS to the medical field was reported in an example for modeling distortion (refer to the paper "Bookstein F. L., Principal warps: thin-plate splines and the decomposition of deformations. IEEE Transactions on Pattern Analysis and Machine Intelligence, 11(6):567–585, 1989"). This application is often used in registering medical images.

(TPS Fitting for Use in the Present Invention)

The fitting based on the TPS, which is for use in the present invention, will now be explained.

Figure 8:
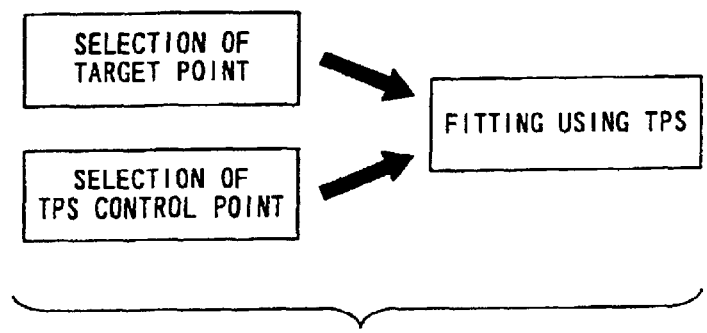
FIG. 8 outlines procedures for performing TPS fitting.

First, from an outlined point of view, the fitting is performed by handing, as target points, pixel values having sensitivity information on initial sensitivity maps, and by fitting the TPS to those values. That is, the control points of the TPS are changed positionally so that the heights of control points are best approximated to the target points. Accordingly the weights are set to their optimums (refer to FIG. 8).

Figure 9:
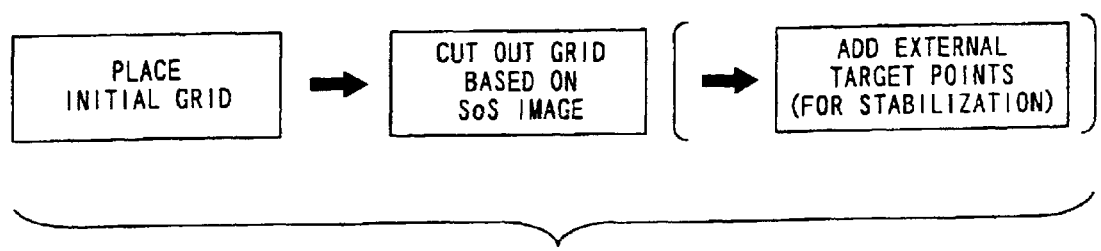
FIG. 9 outlines procedures for selecting target points.

To increase the speed of calculation for the fitting, it is usual that the image is subjected to sub-sampling. This makes it possible to employ only values at the grids, that is, only pixels located at regular intervals on the image. A practical example is that, if the image has a matrix size of 256×256, a grid distance is usually is set to a length of 5 pixels (refer to FIG. 9).

Figure 10:
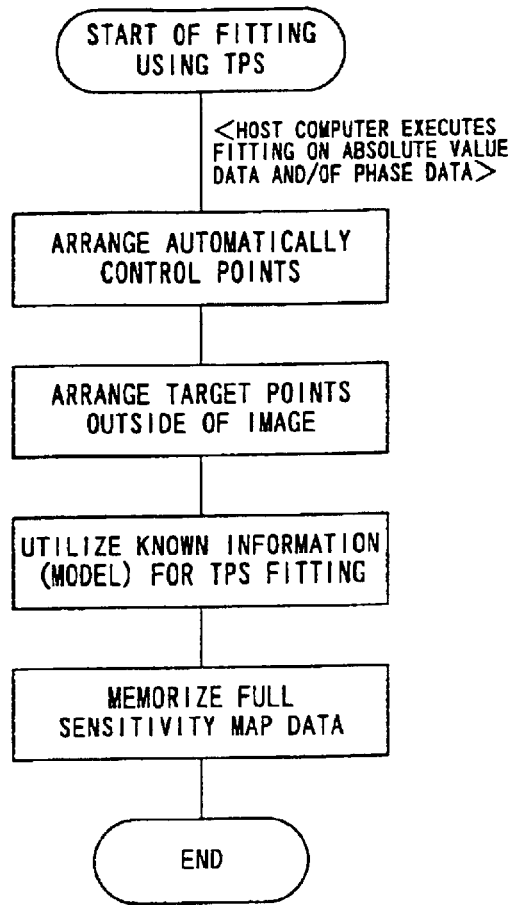
FIG. 10 is a flowchart outlining the fitting processing based on the TPS, in which features of the fitting processing are expressed.

FIG. 10 shows procedures for performing one example of the fitting based on the TPS for use in the present invention. These procedures PS2-1 to PS2-4, which are executed by the host computer 6, are applied to either each of initial sensitivity maps obtained from either one of absolute value data or phase data of the coil images C1 to C3 or each of initial sensitivity maps obtained from both absolute value data or phase data of the coil images C1 to C3.

(Automatic Positioning of Control Points)

Through the first procedure PS2-1, control points, that in, the positions of basis functions are decided automatically.

Figure 11:
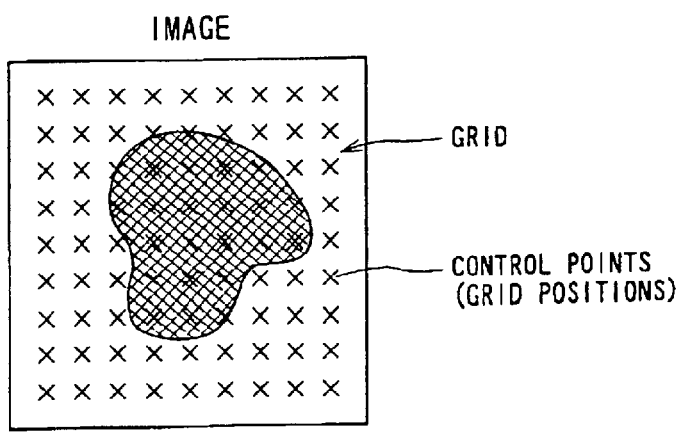
FIG. 11 is a view explaining one mode of automatic arrangement of grids (control points)

To be specific, a grid having predetermined grid positions is automatically set onto an image, as shown in FIG. 11. The control points are therefore arranged on the image on average.

The distance between grid points in the grid is one parameter to decide the number and positions of control points. Typical examples are as follows. For a larger body coil, a grid of 4×4 covering most of an FOV is set to bridge an image. If a coil is small, like a head coil consisting of four element coils each covering nearly ¼ of an image, it is necessary to increase resolution more. Thus, a grid of 10×10 is used, for example.

The grid may be used as means for the final positions of the control points, while another refinement process may be performed as shown in FIG. 12.

Figure 12A:
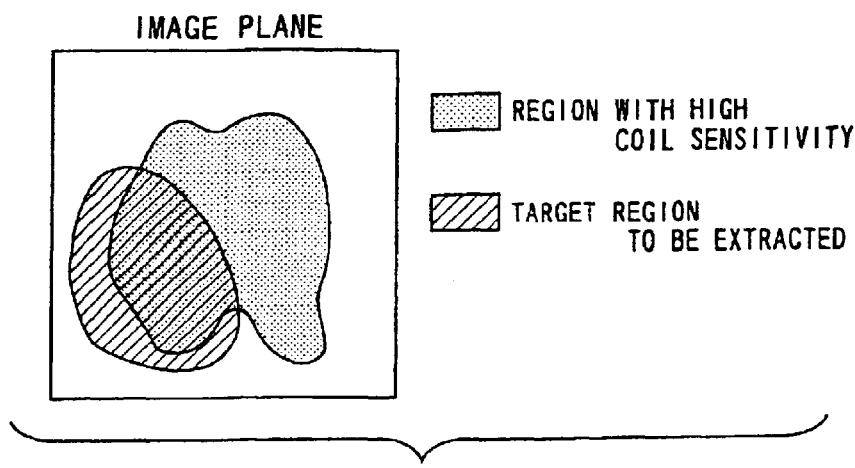
FIGS. 12A to 12C are explanations based on another mode in setting the TPS control points.
Figure 12B:
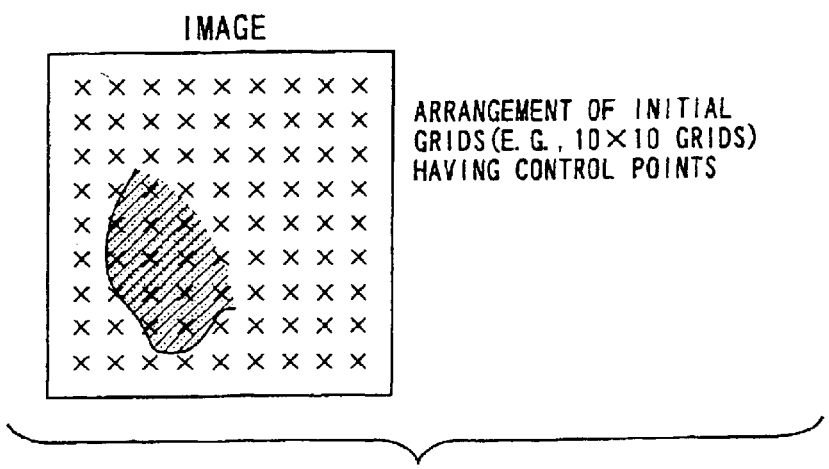
Figure 12C:
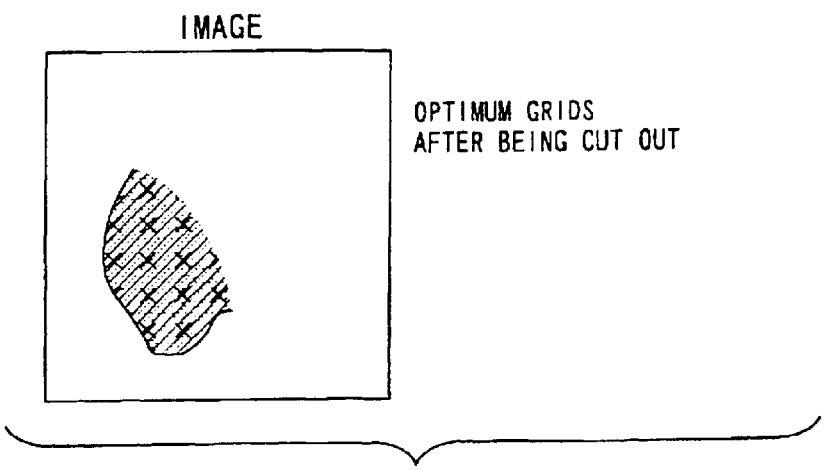

The refinement process shown in FIG. 12A to FIG. 12C is carried out utilizing an initial sensitivity map, as described above. Concretely, under the control of the host computer 6, a region of higher coil sensitivity located within the initial sensitivity map is automatically placed on the image (refer to FIG. 12A), so that an object's region to be depicted, which is overlapped with the higher-coil-sensitivity region, is extracted in an automatic fashion. The foregoing grid is automatically disposed on this extracted image (refer to FIG. 12B). Furthermore, on the image, the grid points which exist in the remaining region other than the overlapped region to be depicted are automatically cut out, and the remaining grid positions, namely, the grid positions which are present on the overlapped region to be depicted are designated as an optimized grid (refer to FIG. 12C). As a result, the grid is regarded as being masked by the initial sensitivity map, resulting in that there remain only control points which exist in a region generating higher-intensity signals (a region of higher coil sensitivity). In consequence, behaviors of fitting curved surfaces are stabilized more in the region that generates no signal or lower-intensity signals.

In this way, the shapes and regions of curved surfaces to be fitted are decided by the number and positions of control points that define basis functions for the TPS. When the number of control points is too short, the flexibility of TPS curved surfaces is limited and an approximation degree to target points becomes low. By contrast, when the number of control points is too much, the fitting will receive a large amount of influence of noise. Hence, the TPS curved surfaces may be far from sufficient smoothness, and deformed. In general, it is preferred that, as shown in FIGS. 12A to 12C, the control points are placed in a region that generates sufficient-intensity signals, without being placed in a region generation no signals or only lower-intensity signals. In such a region that generates no signals or only lower-intensity signals, post-processing may be used to interpolate control points to form smooth ranges of the control points. This will reduce the distortion caused on fitted curved surfaces, which is due to the positions of control points.

(Addition of Target Points to Outside of Image)

The next procedure PS-2 executed by the host computer 6 is directed to addition of target points to the outside of the image. As described above, the target points are pixels having values including sensitivity information on the initial sensitivity map.

The target points are added on account of the following reason. If there is no target point near the boundary inside an image, the behavior of the TPS fluctuates in such a region, thus being not preferred (refer to FIG. 13A(a1)). In particular, slight irregularities in the sensitivity profile in the central part of the image may be emphasized in the boundary region of the image. As a result, a preferred synthesis cannot be expected in the central part of an unfolded image.

To remove this drawback, in the present embodiment, the technique of positively adding target points to predetermined positions located outside the image is employed, the positions being far from the boundary by a predetermined amount of distance. This addition is automatically executed by the host computer 6.

Figure 13A:
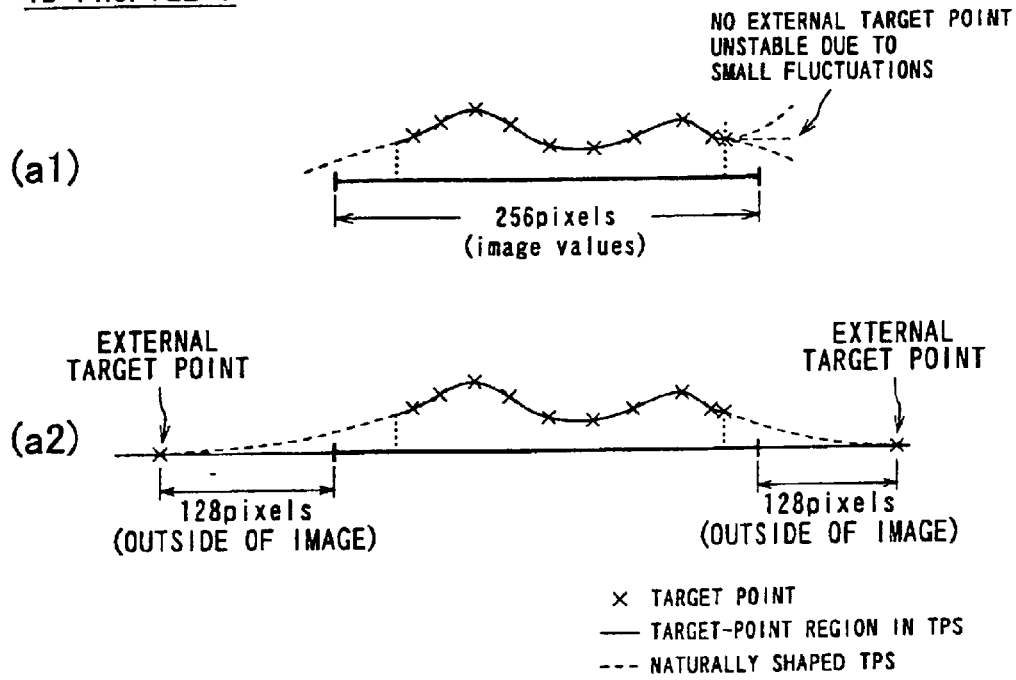
FIGS. 13A and 13B are explanations exemplifying additional arrangement of target points to the outside of an image.
Figure 13B:
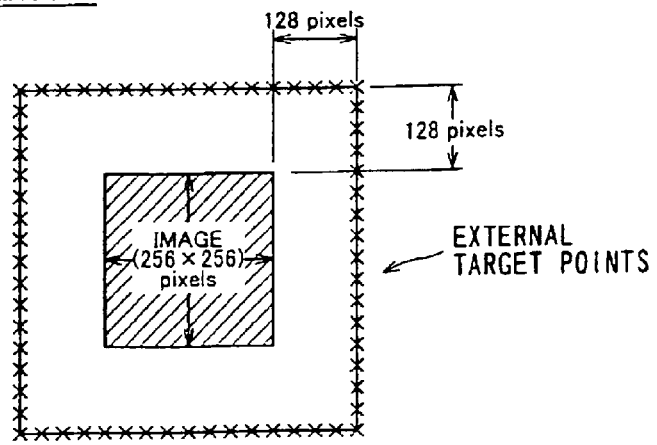

The weights for the additional target points are set to zero, that is, are set to have a curved surface fitted to all the target points, and then optimum value of the weights are decided. FIGS. 13A(a2) and 13B shows one example. FIG. 13A(a2) shows a one-dimensional profile along the TPS curved surface, while FIG. 13B shows a two-dimensional arrangement of externally added target points. By way of example, the distance from the boundary to the externally added target points is set to half of an image matrix.

Adding the target points to the outside of an image allows the TPS to behave in a well controlled manner and to be stabilized. That is, sudden fluctuations or noise-like high peaks of the TPS can be removed near the image boundary.

(TPS Fitting Utilizing Known Information)

The next procedure PS2-3 executed by the host computer 6 is directed to calculation for TPS fitting, which is carried out utilizing known information about the TPS. The known information can be exemplified as being a TPS known model, which can be obtained in advance using a phantom or others.

The early modeling of a coil sensitivity involved scanning with the use of a homogeneous phantom. It has been known well that sensitivity profiles of detection coils change in accordance with various factors depending on each patient. Therefore, in general, the foregoing phantom cannot provide a satisfied model.

However, even if such a phantom is used, a sensitivity profile approximated to "expected sensitivity" can still be provided, from an entire viewpoint in obtaining the coil sensitivity. In the present invention, consideration is given to this fact. That is, the present invention proposes a technique of utilizing a known model (that is, prior model) in estimating sensitivity distributions of coils. Incidentally, this known information (model) is not limited to sensitivity models figured out using a phantom, but sensitivity models produced mathematically by simulation carried out with coil sensitivities.

Figure 14A:
FIGS. 14A to 14C are explanations of one mode in performing the TPS fitting that uses known information.
Figure 14B:
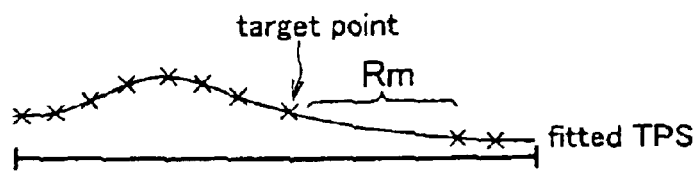
Figure 14C:
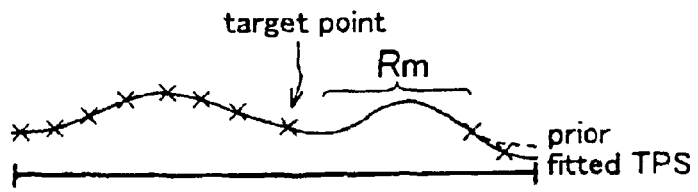

In the present embodiment, the known model is used to make the fitting processing easier and utilize a limitation based on an "expected shape." FIG. 14A exemplifies the known model as a one-dimensional profile. FIG. 14B exemplifies, as a one-dimensional profile, a fitted TPS that uses no known model. As shown therein, in a central right-side region Rm where there is almost no target point, the absence of the target points may lead to erroneous fitting. However, as shown in FIG. 14C, performing the fitting in combination with the known model shown in FIG. 14A makes it possible that the fitting at the region Rm with no target points produces a smooth profile similar to the genuine profile.

The following is a mathematical approach to this novel fitting processing, which is carried out by the host computer 6.

Assume that target data to be interpolated is $S(x_k, y_k)$ (k=1, . . . , n) and data indicative of a known sensitivity model is $P(x_k', y_k')$ (k'=1, . . . , n': n' is the number of sample data). In the case of n'>n (the normal case), a known model over an entire FOV is obtained. Even in such a case, the number of target points changes depending on an object's structure to be imaged.

A new error function is defined as follows:

$$\varepsilon^2 = \alpha \sum_{k=1}^{n} \left( S(x_k, y_k) - \sum_{i=1}^{m} w_i F_i(x_k, y_k) \right)^2 + \\ (1-\alpha) \sum_{k'=1}^{n'} \left( P(x_k', y_k') - \sum_{i=1}^{m} w_i F_i(x_k', y_k') \right)^2 \quad (14)$$

This error function can be rewritten as follows:

$$\varepsilon^2 = \alpha \epsilon_S^2 + (1-\alpha)\epsilon_P^2 \quad (15)$$

In this formula (15), $\alpha$ is a weighting factor deciding a relative contribution of a target point, concerning the known information. Normally, it is preferred to give preference to obtaining a TPS plane very close to a known model over accurate data fitting, so that $\alpha \gg 0.5$ is set. Hence, for a region in which target data can be employed, the term of $\epsilon_S^2$ is effective, such that the data is fitted well to the term. Further, the term of $\epsilon_P^2$ serves as a factor to avoid the fitting from being shifted to a larger extent from the known model. By contrast, for a region in which target data cannot be employed, only the term of $\epsilon_P^2$ contributes to the error function, thus making the known model forcibly approximate to the known model in an effective manner.

The particularity of this fitting processing will now be explained. To minimize the error function $\epsilon$, it is necessary that the following formula is established.

$$\alpha \frac{\partial \varepsilon_s^2}{\partial w_j} + (1-\alpha) \frac{\partial \varepsilon_P^2}{\partial w_j} = 0, j = 1 \cdots m \quad (16)$$

Thus, the following formula can be obtained.

$$0 = 2\alpha \sum_{k=1}^{n} \left( S(x_k, y_k) - \sum_{i=1}^{m} w_i F_i(x_k, y_k) \right) F_j(x_k, y_k) + \\ 2(1-\alpha) \sum_{k'=1}^{n'} \left( P(x_k', y_k') - \sum_{i=1}^{m} w_i F_i(x_k', y_k') \right) F_j(x_k', y_k'), \\ j = 1 \cdots m \quad (17)$$

Hence, if assuming that:

$$A_n = \begin{bmatrix} F_1(x_1, y_1) & F_2(x_1, y_1) & \cdots & F_m(x_1, y_1) \\ F_1(x_2, y_2) & F_2(x_2, y_2) & \cdots & F_m(x_2, y_2) \\ \vdots & \vdots & \vdots & \vdots \\ F_1(x_n, y_n) & F_2(x_n, y_n) & \cdots & F_m(x_n, y_n) \end{bmatrix} \quad (18)$$

-continued $$A_{n'} = \begin{bmatrix} F_1(x_1, y_1) & F_2(x_1, y_1) & \cdots & F_m(x_1, y_1) \\ F_1(x_2, y_2) & F_2(x_2, y_2) & \cdots & F_m(x_2, y_2) \\ \vdots & \vdots & \vdots & \vdots \\ F_1(x_{n'}, y_{n'}) & F_2(x_{n'}, y_{n'}) & \cdots & F_m(x_{n'}, y_{n'}) \end{bmatrix} \quad (19)$$

$$s=[S(x_1,y_1)S(x_2,y_2)\ldots S(x_n,y_n)]^T \quad (20)$$

$$p=[P(x_1,y_1)P(x_2,y_2)\ldots P(x_{n'},y_{n'})]^T, \quad (21)$$

a system to minimize the error can be expressed as:

$$\alpha A_n^T s - \alpha (A_n^T A_n)w + (1-\alpha)A_{n'}^{'T}p - (1-\alpha)(A_{n'}^{'T}A_{n'}')w = 0, \quad (22)$$

and summarizing the terms results in the following formula.

$$\alpha(A_n^T A_n)w + (1-\alpha)(A_{n'}^{'T}A_{n'}')w = \alpha A_n^T s + (1-\alpha)A_{n'}^{'T}p \quad (23)$$

Solving this formula with regard to the parameters of the TPS produces the following.

$$w = (\alpha(A_n^T A_n) + (1-\alpha)(A_{n'}^{'T}A_{n'}'))^{-1}(\alpha A_n^T s + (1-\alpha)A_{n'}^{'T}p) \quad (24).$$

In this way, utilizing the known information (known model) gives more stability to estimating the sensitivity distribution. Particularly, the sensitivity profile can be stabilized remarkably in an object's region that generates no signal or lower-intensity signals (that is, there is provided no target point). In addition, a difference between the known model and the finally obtained TPS gives additional information in relation to both of coil characteristics and advantages of external factors to coil detection sensitivity profiles.

In the present embodiment, MR image data composed of complex-number data is expressed by its absolute value data and its phase data and the foregoing estimation processing is applied to at least one of the absolute value data and the phase data so that a sensitivity map is obtained coil by coil. In general, even when different splines are made to fit to both of real-part data and imaginary-part data, respectively, it is difficult to acquire a satisfied result. The reason is that a slight difference between the splines fitted to both the real-part and imaginary-part data gives rise to larger amounts of artifact on an image. However, in the present embodiment, the fitting has been applied individually to both the absolute value data and the phase data, thus providing a fully satisfied result. In particular, the fitting to the absolute value data provides sensitivity maps of higher precision.

As simpler processing, there may be provided the technique of applying the fitting to only the absolute value data, and combining a fitted result with an original phase map. This simple processing still provides an estimated result comparable to the TPS fitting applied to both the absolute value data and the phase data. Performing the TPS fitting on only an absolute value image will, in addition to a reduction in calculation cost, eliminates the need for unlapping changes from 0 to $2\pi$ in the phase on a phase map.

Figure 15:
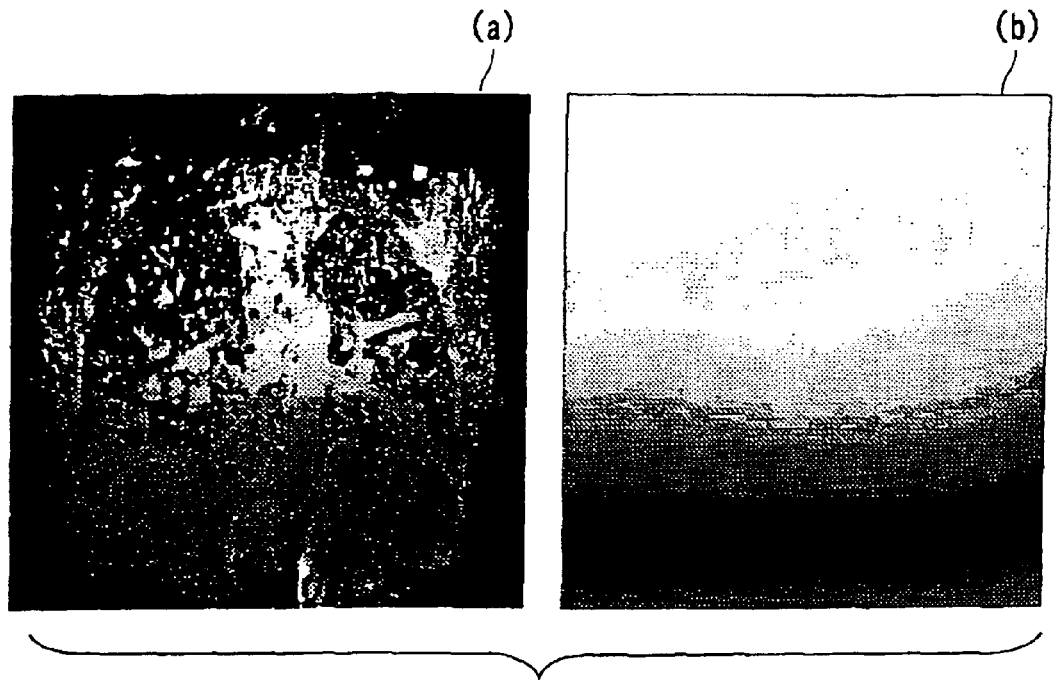
FIG. 15 exemplifies images (shown by pictures) of both an initial sensitivity map and an unfolding sensitivity map.
Figure 16:
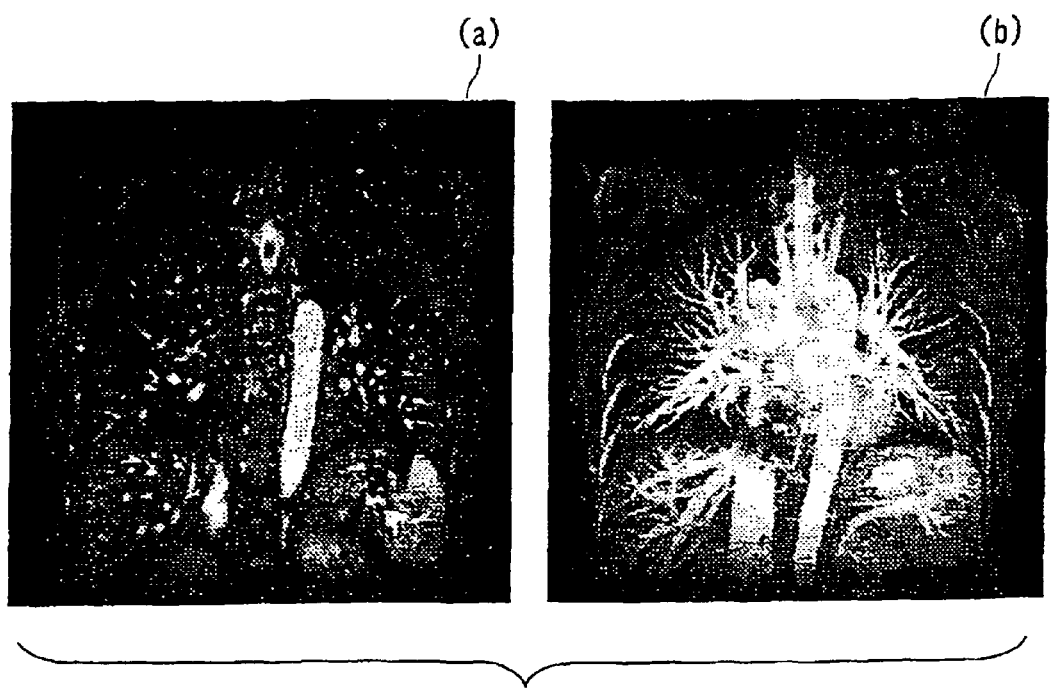
FIG. 16 exemplifies images (shown by pictures) obtained as unfolded results.

Images are exemplified in both FIGS. 15 and 16 in relation to the estimation of sensitivity maps according to the present invention. FIG. 15(a) shows an image of an initial sensitivity map, while FIG. 15(b) shows a full-FOV sensitivity map produced by fitting the TPS to the image on the left side (FIG. 15(a)). FIGS. 16(a) and (b) shows two images unfolded using the sensitivity map shown in FIG. 15(b), which correspond to both images shown in FIGS. 1(a) and (b), respectively. Of these images, the image shown in FIG. 16(a) is provided as a slice image, while the image shown in FIG. 16(b) is provided as an image obtained by applying MIP processing to all unfolded slice images.

In the present embodiment, the TPS has high degree of freedom, which results from the fact that the positions and heights (weights) of the control points functioning as parameters. Using such TPS makes it possible that smooth and high-precision sensitivity maps can be produced from initial sensitivity maps of which data is insufficient in the acquisition density thereof.

The foregoing initial sensitivity maps trace only an object's high-sensitivity region that emanates signals of higher intensities. Thus, if the maps are produced from an object's region that emanates no signal or almost no signal, there occurs the problem, as described before. Such a case is true of obtaining a pulmonary MRA image based on, for example, an FBI technique. The FBI technique has been known by a paper "Miyazaki M. et al., Non-Contrast-Enhanced MR Angiography Using 3D ECG-Synchronized Half-Fourier Fast Spin Echo, JMRI 12:776–783, 2000."

In contrast, as explained, the present invention has been configured to refine the initial sensitivity maps using the TPS. Hence, unlike the conventional in which the simple low-pass filtering and polynomial fitting were used for refinement, high-precision PPA images can be provided, even when imaging is performed on condition that only coarse echo data is acquired, like the imaging from the pulmonary region, an object exists at an FOV end along the phase encode direction, and/or element coils of which number is less are employed.

Further, a technique for estimating a coil sensitivity using the TPS has been reported by a paper "Dawant B. M., et al., Correction of intensity variations in MR images for computer-aided tissue classification, IEEE Transactions on Medical Imaging 12(4):770–781, 1993." However, this estimation technique has focused on the division of an image. In contrast, the present invention has paid attention to well estimating sensitivity information necessary for image synthesis in fast imaging. In addition, Dawant et al. uses a single-coil image, while the present invention uses the multicoil so as to compute the initial sensitivity maps, as described before.

Additionally, Dawant et al. proposes a scheme to allow the target points to be selected by hand or via a neural network (requiring a pre-exercise for operations). In contrast, in the present invention, the target points can be selected with the use of the initial sensitivity maps, thus making the operations simpler under complete automation.

In the foregoing embodiment, the description has been made toward 1) automatic positioning of the control points, 2) additional arrangement of the target points to the outside of an image, 3) utilization of known information, and 4) concurrently performed TPS fitting to both the absolute value components and phase components. However, the present invention is not always restricted to such modes, but may be applied to any one or more modes selected from the functions of 1) to 4).

The foregoing TPS is a representative of GCS (Global Coverage Splines) used for performing the fitting over a wide area, and the GCS includes additional techniques of using B-splines and Bezier Surfacded. Additionally, the foregoing synthesis processing on the square root of sum-of-squares (SoS) may be replaced by simple sum computation.

Furthermore, in the foregoing embodiment, the two-dimensional fitting has been considered, as exemplified in FIGS. 11 to 13A and 13B, for the sake of an easier understanding of the TPS fitting. The TPS fitting can be done three-dimensionally, not limited to the two-dimension. An example of the three-dimensional TPS fitting will now be outlined in connection with FIGS. 17 and 18.

Figure 17:
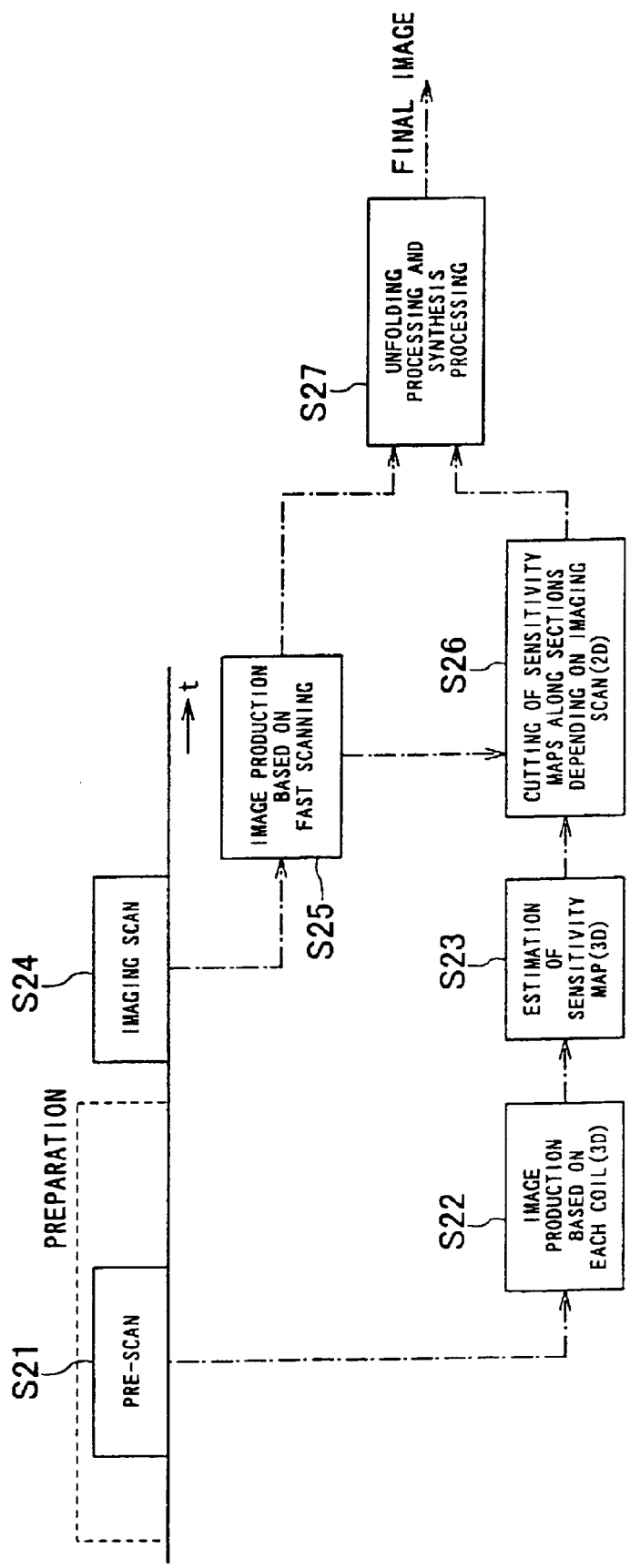
FIG. 17 is an illustration outlining procedures for obtaining a final full-FOV MR image in the parallel MR imaging, in the case that a three-dimensional TPS fitting is adopted.

As shown in FIG. 17, as one step of the preparation conducted before an imaging scan, a sensitivity map of each coil of the multicoil 7R is necessary to be estimated. For this estimation, a two-dimensional pre-scan (for example, based on a multi-slice technique) or a three-dimensional pre-scan is carried out under a predetermined fast pulse sequence every RF coil 7a (to 7c) (step S21). Thus a three-dimensional volume data can be acquired.

Echo data acquired through the pres-scan and processed by the receiver 8R is sent to the host computer 6, where, for each RF coil, the echo data is reconstructed into a real-space image C1 (to C3) (step S22). The host computer 6 then uses the images C1 to C3 to apply, for example, the foregoing extrapolation technique (i.e., adding target points to the outside of the image: refer to FIGS. 13A and 13B) to the image data, so that three-dimensional sensitivity maps M1' to M3' of the individual RF coils of the multicoil 7R are estimated (step S23). The three-dimensional data of these sensitivity maps are preserved into the storage 11.

Meanwhile, by the parallel MR imaging on a two-dimensional or three-dimensional imaging scan, echo data is acquired (step S24). This echo data is processed by the receiver 8R, and then sent to the host computer 6, in which the data is reconstructed into real-space images every RF coil (step S25). Then, a section of which position and angle are made to agree with each reconstructed image (that is, a section consistent with the scan conditions in the imaging scan) is cut out, image by image, from the three-dimensional sensitivity map data previously stored in the storage 11 (step S26).

Thus, a plurality of images obtained with the imaging scan are subjected to unfolding processing, image by image, with the use of the two-dimensional sensitivity maps each cut out along the individual sections in the three-dimensional sensitivity map, and then synthesized into a final full-FOV image (step S27).

Figure 18:
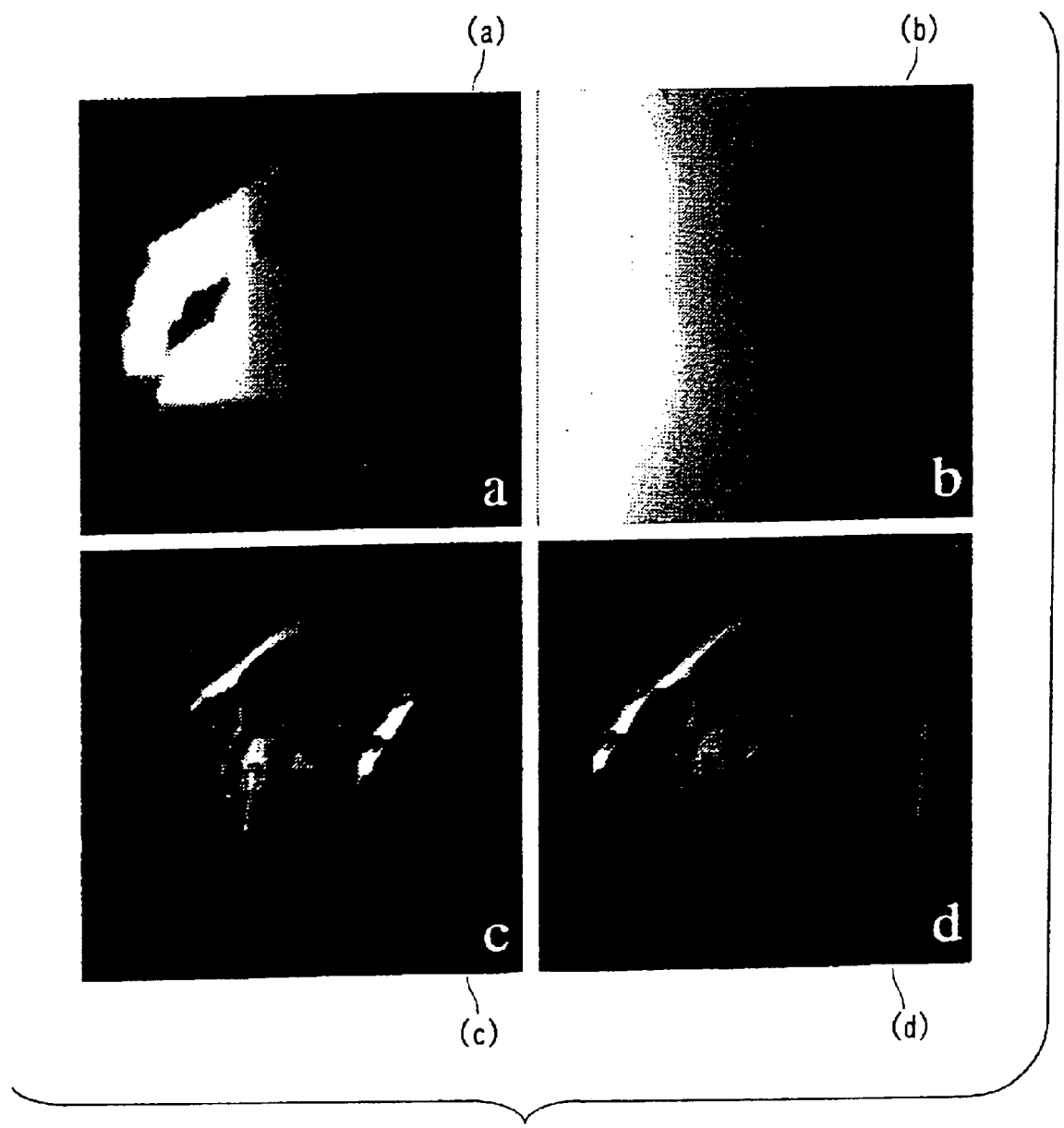
FIG. 18 exemplifies images (shown by pictures) obtained through the three-dimensional TPS fitting.

FIG. 18 exemplifies images produced based on the foregoing three-dimensional TPS fitting. FIG. 18(a) is a reference showing a sensitivity map along a certain section, which is compared with FIG. 18(b). The sensitivity map shown in FIG. 18(a) is cut out from a three-dimensional sensitivity map produced without adding the foregoing target points to the outside of an image.

In contrast, FIG. 18(b) shows a sensitivity map along a certain section, which is cut out from a three-dimensional sensitivity map produced by adding the foregoing target points to the outside of an image. It can be understood that the sensitivity map in FIG. 18(b) is denser and smoother in the changes in the sensitivity distribution than that in FIG. 18(a). This advantage results from employment of adding the target points. An image shown in FIG. 18(c) is subjected to unfolding (development of folded images) by means of the sensitivity map shown in FIG. 18(b), resulting in an image shown in FIG. 18(d). Almost no artifacts due to folding were found in this image shown in FIG. 18(d).

As a result, the three-dimensional TPS fitting is especially effective for imaging carried out when there is a possibility that an object moves, thus making sensitivity estimation stable and providing robust parallel MR imaging.

As described so far, in the coil-sensitivity distribution estimating apparatus and the method thereof, and the MRI apparatus, the initial sensitivity maps are fitted with the GCS to obtain the final sensitive maps. Hence, unlike the conventional refine techniques such as simple low-pass filtering and locally applied polynomial fitting, the sensitivity maps of plural element coils of a multicoil can be estimated individually with high precision, even when an object's region to be imaged include an area that emanates only coarse echo data. Thus, when the MRI apparatus performs the multicoil fast imaging, the high-precision sensitivity map is used for accurate unfolding processing. Compared to the conventional multicoil fast imaging, therefore, there are less artifacts, whereby providing higher-quality and superior-depiction MR images.

The method of estimating coil sensitivity according to the foregoing embodiment has been explained about a sensitivity map for unfolding in the parallel MR imaging. Alternatively, this estimation method may be applied to coil sensitivity correction in MR imaging involving a phased array coil (PAC), which is categorized differently from the parallel MR imaging. For instance, such correction involves multiplication of the inverse image of a sum-of-squares (SoS) image produced from synthesis of estimated sensitivity maps of individual element coils, the inverse image being calculated by employing a whole-body (WB) coil image as a denominator.

The present invention is not limited to the configurations listed the above embodiments, but a person skilled in the art can create a variety of constructions adequately altered or deformed within the scope of the claims.

INDUSTRIAL APPLICABILITY

As described above, even when an object's region that allows only coarse echo data to be acquired is subjected to imaging, sensitivity maps of plural element coils composing a multicoil are estimated with high precision, respectively. Thus, a less-artifact, wide-FOV and excellent-depiction MR image can be obtained quickly. Accordingly, a diagnostic performance is improved, while burdens on a patient and an operator are relieved remarkably, thus contributing largely to development of a medical MR imaging.

What is claimed is:

1. A coil sensitivity distribution estimating method for estimating a sensitivity distribution of a multicoil composed of a plurality of RF coils, the multicoil being used for parallel MR imaging, said method comprising:
    producing an initial sensitivity map of the multicoil; and
    obtaining an unfolding sensitivity map by fitting GCS (Global Coverage Splines) to the initial sensitivity map by performing processing that includes automatic positioning of a basic function of the GCS using a grid in which grid points thereof become control points.

2. A coil sensitivity distribution estimating apparatus configured to estimate a sensitivity distribution of a multicoil composed of a plurality of RF coils, the multicoil being used for parallel MR imaging, said apparatus comprising:
    production means for producing an initial sensitivity map of the multicoil; and
    fitting means for obtaining an unfolding sensitivity map by fitting GCS (Global Coverage Splines) to the initial sensitivity map, wherein the fitting means has a means for performing automatic positioning of a basis function of the GCS by using a grid in which grid points thereof become control points.

3. A coil sensitivity distribution estimating apparatus as in claim 2, wherein the production means includes means for producing the initial sensitivity map by synthesizing pixel values of images acquired respectively by the plurality of RF coils.

4. A coil sensitivity distribution estimating apparatus as in claim 2, wherein the production means includes means for using, as the initial sensitivity map, an image acquired using a whole-body coil.

5. A coil sensitivity distribution estimating apparatus as in claim 2, wherein the fitting means includes means for additionally performing processing composed of at least one of (i) external addition of a target point to an image in performing the unfolding processing, and (ii) embedding known information about the sensitivity map for the unfolding processing.

6. A coil sensitivity distribution estimating apparatus as in claim 2, further comprising:
   scanning means for scanning an object that is examined in order to acquire echo data via the multiple coil, wherein the production means includes means for producing the initial sensitivity map of the multicoil based on the echo data acquired by the scanning means.

7. A coil sensitivity distribution estimating apparatus as in claim 2, wherein the production means and the fitting means are configured to apply both the production of the initial sensitivity map and the obtaining of the sensitivity map to at least one of absolute value components of MR data and phase components of the MR data.

8. A coil sensitivity distribution estimating apparatus as in claim 2, wherein the production means includes means for producing a two-dimensional initial sensitivity map of each RF coil based on the echo data and
   the fitting means includes means for obtaining a two-dimensional unfolding sensitivity map by fitting the GCS to the two-dimensional initial sensitivity map.

9. A coil sensitivity distribution estimating apparatus as in claim 2, wherein the production means includes means for producing a three-dimensional initial sensitivity map of each RF coil based on the echo data and
   the fitting means is formed into means for obtaining a three-dimensional unfolding sensitivity map by fitting the GCS to the two-dimensional initial sensitivity map.

10. A magnetic resonance imaging apparatus configured to obtain an MR image of an object that is examined using a multiple coil composed of a plurality of RF coils, said apparatus comprising:
    first production means for producing first sensitivity maps of the RF coils, respectively, on the basis of echo data received from the plurality of RF coils of the multicoil and echo data acquired from a pre-scan;
    second production means for producing second sensitivity maps by fitting GCS (Global Coverage Splines) to the first sensitive maps, respectively;
    reconstruction means for reconstructing echo data scanned by parallel MR imaging and received via the plurality of RF coils of the multicoil; and
    imaging obtaining means for obtaining the MR image by processing an image reconstructed by the reconstruction means, the processing including unfolding processing carried out using the second sensitivity maps, wherein the first production means comprises:
    scanning means for obtaining volume data made up of three-dimensional echo data by performing the pre-scan, and
    calculation means for calculating, as the first sensitivity map, a first three-dimensional sensitivity map of each RF coil on the basis of the volume data,
    the second production means including a means for fitting the GCS to each three-dimensional first sensitivity map in order to obtain, as the second sensitivity map, a second three-dimensional sensitivity map, and
    the image obtaining means includes cutting means for cutting out a sectional sensitivity map from the second three-dimensional sensitivity map depending on the image reconstructed by the reconstruction means and unfolding means for performing the unfolding processing with the use of the sectional two-dimensional map cut out by the cutting means.

11. A magnetic resonance imaging apparatus as in claim 10, wherein the first production means includes means for producing the first sensitivity map by synthesizing pixel values of images acquired respectively by the plurality of RF coils.

12. The magnetic resonance imaging apparatus as in claim 10, wherein the second production means also includes means for performing processing composed of at least one of external addition of a target point to an image in performing the unfolding processing, and embedding known information about the sensitivity map for the unfolding processing.

13. A magnetic resonance imaging apparatus configured to obtain an MR image of an object that is examined using a multicoil composed of a plurality of RF coils, the apparatus comprising:
    first production means for producing first sensitivity maps of the RF coils, respectively, on the basis of echo data received from the plurality of RF coils of the multicoil and echo data acquired from a pre-scan;
    second production means for producing second sensitivity maps by fitting GCS (Global Coverage Splines) to the first sensitive maps, respectively, wherein the second production means has a means for performing processing including automatic positioning of a basis function of the GCS by using a grid in which grid points thereof become control points;
    reconstruction means for reconstructing echo data scanned by parallel MR imaging and received via the plurality of RF coils of the multicoil; and
    imaging obtaining means for obtaining the MR image by processing an image reconstructed by the reconstruction means, the processing including unfolding processing carried out using the second sensitivity maps.

* * * * *